United States Patent [19]

Aizawa

[11] Patent Number: 4,698,601
[45] Date of Patent: Oct. 6, 1987

[54] PHASE LOCKED LOOP

[75] Inventor: Iwao Aizawa, Yokohama, Japan

[73] Assignee: Hitachi, Ltd., Tokyo, Japan

[21] Appl. No.: 826,675

[22] Filed: Feb. 6, 1986

[30] Foreign Application Priority Data

Feb. 20, 1985 [JP] Japan .................................. 60-30330

[51] Int. Cl.$^4$ ........................... H03L 7/06; H04N 5/04
[52] U.S. Cl. ...................................... 331/1 A; 331/14; 331/20; 358/158
[58] Field of Search ...................... 331/1 A, 14, 20, 25; 358/158

[56] References Cited

U.S. PATENT DOCUMENTS

| | | | |
|---|---|---|---|
| 4,059,842 | 11/1977 | Meacham | 331/20 X |
| 4,400,667 | 8/1983 | Belkin | 331/1 A |
| 4,422,176 | 12/1983 | Summers | 331/1 A X |
| 4,538,119 | 8/1985 | Ashida | 331/1 A |
| 4,567,447 | 1/1986 | Srivastava et al. | 331/20 X |

*Primary Examiner*—Eugene R. Laroche
*Assistant Examiner*—David Mis
*Attorney, Agent, or Firm*—Antonelli, Terry & Wands

[57] ABSTRACT

An oscillating circuit using a phase locked loop (PLL) which includes a voltage controlled oscillator (VCO), a phase comparator, a low pass filter (LPF) and a phase extractor has a small circuit scale. Every repeat period of a reference pulse signal being provided to one input terminal of the phase comparator and having a frequency of 1/N times of an oscillating frequency of the VCO, one of leading edges of the output pulses of the VCO near a leading edge of the reference pulse signal is selectively extracting by the phase extractor. The extracted leading edge of the output pulse of the VCO is provided to another input terminal of the phase comparator and phase-compared with the leading edge of the reference pulse signal by the phase comparator. A phase error signal generated from the phase comparator is supplied through the LPF to the VCO as a control voltage thereof in order to stabilize the oscillating frequency.

14 Claims, 35 Drawing Figures

FIG. 1
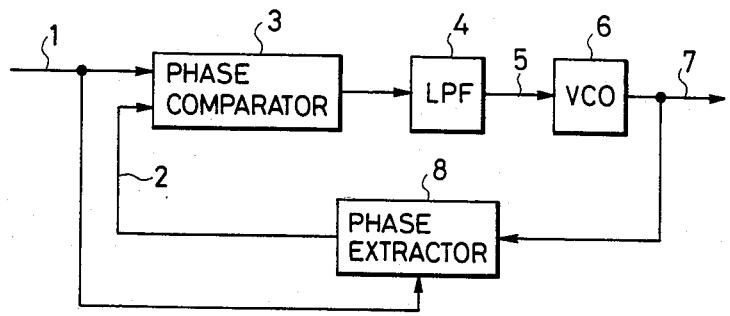
FIG. 2A
FIG. 2B
FIG. 2C
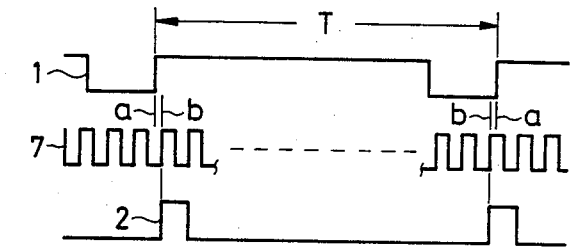
FIG. 3
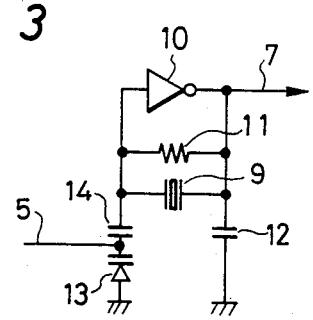

PHASE LOCKED LOOP

BACKGROUND OF THE INVENTION

This invention relates to an oscillating circuit, especially an oscillating circuit which is suitable to generate an oscillating output having a stable oscillating frequency phase-locked to a reference signal of a constant frequency.

In an apparatus dealing with a video signal, it is necessary to use high-frequency pulse signals having predetermined phases related to a video signal period, for example, a horizontal scanning period. The high-frequency pulse signals are used as a sampling pulse or a clock pulse of an apparatus for converting the video signal to a digital signal, a delay circuit including a charge coupled device (CCD) for the video signal, and so on.

In the prior art, a phase locked loop (hereinafter PLL) having a voltage controlled oscillator (hereinafter, VCO) has been popularly used. Basically in this loop, an output of the VCO is divided, the divided output is phase-compared with a reference signal, and the VCO is controlled by an error signal thereof, so that a stable signal having higher frequency than the frequency of the reference signal could be obtained. Generally in a video apparatus, as a frequency of the reference signal, a horizontal scanning frequency ($f_H$) is used and as an oscillating frequency of the VCO, a frequency equal to or lower than 910 times $f_H$ is used. Since $f_H$ of the NTSC color television system is 15,734.246 Hz, 910 times this frequency becomes about 14.3 MHz. As it is possible for digital circuit elements in the market to operate adequately at such a frequency, the above PLL circuit has been used.

In the above art, however, since it is necessary to use a divider which divides the output of the VCO into the frequency of the reference signal, there are some problems. That is, the circuit scale becomes large and a noise generated at the VCO is superimposed on the video signal.

SUMMARY OF THE INVENTION

It is an object of the present invention to provide an oscillating circuit which does not include a divider.

It is another object of the invention to provide a PLL type oscillator having a small circuit scale.

To accomplish the above objects, according to the present invention, an oscillating circuit comprises a voltage controlled oscillating means which oscillates at a frequency which is N times that of a frequency of a reference signal, means for selectively extracting one of the predetermined phases of the oscillating output near a predetermined phase of the reference signal every repeated period of the reference signal, means for comparing the extracted phase of the oscillating output with the predetermined phase of the reference signal, and a low pass filter (LPF) for passing the output of the phase comparing means, wherein the output of the LPF is used as a frequency control signal of the voltage controlled oscillating means.

Further, according to the present invention, as the extracting means and the comparing means, a digital circuit that includes three D-type flip flops (DFFs) or another digital circuit that includes two T-type flip flops (TFFs) and a DFF is provided. In the former circuit, input terminals D of two DFFs receive the reference signal and clock terminals CK of the two DFFs receive the oscillating output of the voltage controlled oscillating means and an inverted pulse of the oscillating output thereof, respectively. Q outputs of the two DFFs are provided to a clock terminal CK and an input terminal D of the third DFF, respectively. The Q output of the third DFF is supplied to the LPF to generate the frequency control signal.

Also, in the lattter circuit, clear terminals CLR of the two TFFs receive an inverted signal of the reference signal and clock terminals CK of the Two TFFs receive an inverted pulse of the oscillating output and the oscillating output, respectively. Q outputs of the two TFFs are provided to a clock terminal CK and an input terminal of the DFF, respectively. The Q output of the DFF is supplied to the LPF to generate the frequency control signal.

As the predetermined phases of the oscillating output, for example, leading edges or trailing edges of the oscillating output are used. Also, as the predetermined phase of the reference signal, a leading edge or a trailing edge every repeated period of the reference signal is used. In this technical area, the integer N is set about several hundreds or several tens.

BRIEF DESCRIPTION OF THE DRAWINGS

FIG. 1 shows a block diagram of an embodiment of an oscillating circuit of the present invention, FIGS. 2A to 2C illustrate waveforms of main parts of the block diagram shown in FIG. 1, FIG. 3 shows a circuit diagram of an example of a voltage controlled oscillator 6 of the embodiment shown in FIG. 1.

DETAIL DESCRIPTION OF THE PREFERRED EMBODIMENTS

Figure 4:
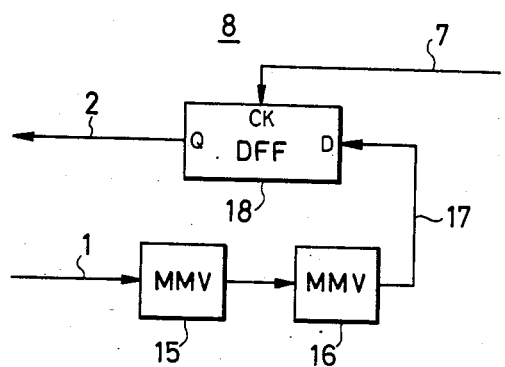
FIG. 4 shows a block diagram of an embodiment of a phase extractor 8 shown in FIG. 1.

FIG. 1 shows a block diagram for explaining the essence of the present invention. Referring to FIG. 1, a reference pulse signal 1 and a feedback signal 2 are compared at a phase comparator 3. An output signal of the phase comparator 3 is filtered by a lowpass filter (LPF) 4. A voltage controlled oscillator (VCO) 6 is controlled by a frequency control voltage 5 supplied from the LPF4. In the present invention, in order to generate the feedback signal 2, a phase extractor 8 is used in place of a divider of the prior art. The phase extractor 8 extracts one of the leading edges of the output signal 7 of the VCO6, which appears near to a leading edge of the reference pulse signal 1 every repeated period of the reference pulse signal.

FIG. 2A illustrates a waveform of the reference pulse signal 1. T designates the period of the reference pulse signal 1. FIG. 2B illustrates the output signal 7 of the VCO6. At every repeated period of the leading edge a of the reference pulse signal 1, the leading edge b of the output signal 7 of the VCO6 is extracted, so that the feedback signal 2 shown in FIG. 2C having a phase information of the pulse edge b is generated. The phase comparator 3 compares the reference pulse signal 1 with the feedback signal 2 and provides the output signal, which has a high level in the case shown in the left side of FIG. 2C and a low level in the case shown in the right side of FIG. 2C.

Here, in order to stabilize the oscillating frequency of the VCO6, it is necessary to maintain an interval between the leading edge b shown in the left side and the leading edge b shown in the right side a predetermined cycle number of the output signal 7. Namely, in order to stabilize the oscillating frequency of the VCO6 into Nfo (N: an integer, fo: a frequency of the reference pulse signal 1), the leading edge b shown in the right side must become the Nth pulse edge in the case that the leading edge b shown in the left side is numbered zero-th and the leading edges, each of which varies from a low level to a high level and positions at the right side of the zero-th leading edge, are sequentially numbered from the first.

The above condition will be satisfied as described below. As the reference pulse signal 1, a signal having frequency stability generated from a crystal oscillator is used. For examply, a horizontal scanning frequency pulse transmitted from a broadcasting station or the same kind of pulse generated from a television camera is used. The frequency variation of these pulses is generally stabilized ±10 to 20 ppm to the reference value thereof.

Further, as the VCO6 in FIG. 1, a crystal oscillating type VCO using a crystal oscillator 9 shown in FIG. 3 is used. Referring to FIG. 3, the numerals 10, 11, 12 and 13 denote an inverter, a resistance, a condenser and a varactor diode, respectively. The VCO shown in FIG. 3 is well known in this technical area. When the value of the frequency control voltage 5 becomes bigger, the capacitance of the varactor diode 13 becomes lower and the output signal 7 of the VCO becomes higher. The frequency variation range of the VCO is designed to be Nfo ±60 ppm.

As a result, the maximum deviation of the oscillating frequency of the VCO6 becomes lower than ±100 ppm. Namely, in the case that the frequency of the reference pulse signal 1 is set at the horizontal scanning frequency $f_H$ and the frequency of the VCO is set $910 \times f_H$, that is, about 14.3 MHz in the NTSC television system, the pulse number of the VCO per one period of the reference pulse signal becomes 910±0.091. Therefore, the above condition is satisfied.

FIG. 4 shows a block diagram of an embodiment of the phrase extractor 8. FIGS. 5A to 5D illustrate waveforms of main parts thereof.

Figure 5A:
FIGS. 5A to 5D illustrate waveforms of main parts of the block diagram shown in FIG. 4.
Figure 5B:
Figure 5C:
Figure 5D:
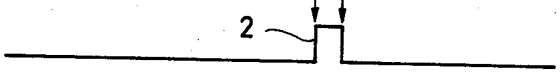

Referring to FIG. 4, the numerals 15 and 16 designate monostable multivibrators (MMV), and the numeral 18 denotes a D-type flip-flop (DFF). A pulse 17 shown in FIG. 5C is generated by the MMV 16. The pulse 17 has a pulse width, which is narrower than one period of the output signal 7 and contains a timing of the leading edge of the reference pulse signal 7. When the pulse 17 is provided to the input terminal D of the DFF 18 and the output signal 7 is suppled to the clock terminal CK, the DFF 18 produces a pulse 2 having a phase coincident with the leading edge of the reference pulse signal 7 at the output terminal Q.

Since the pulse width of the pulse 17 is set narrower than one period of the output signal 7, only one leading edge is extracted every repeated period of the reference pulse signal. In a transient state just after switching on a power supply, there is a possibility that the leading edge of the output signal 7 can not be detected or the leading edge of the predetermined number ±1 is detected. However, concerning the former case, if a digital type phase comparator is used as the phase comparator 3, it is possible to generate such a value of the control voltage 5 as to make the oscillating frequency higher in the case of absence of the feedback signal 2. Also, if parameters of the VCO6, for example, the capacitance of the condenser 12, is determined so that the output signal 7 of the VCO6 becomes the predetermined frequency nearly at a center value between the maximum value and the minimum value of the control voltage 5, there is no possibility that the state of having no pulse at the output terminal Q of the DFF 18 is held.

Further, concerning the latter case, since the phase deviation of the output signal 7 every repeated period of the reference pulse signal 1 is very little, the predetermined numbered leading edge of the output signal 7 is selectively extracted in a stationary state.

In the embodiment shown in FIG. 4, it is necessary to use the MMV 15 and the MMV 16, the phase of the generated pulse of which is stable to an ambient condition, for example, a variation of the supply voltage or the ambient temperature.

Figure 6:
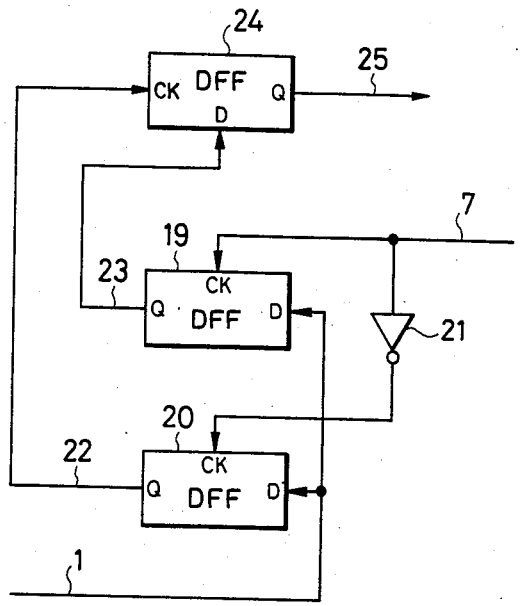
FIG. 6 shows a block diagram of an embodiment of the phase extractor 8 and a phase comparator 3 shown in FIG. 1, FIGS. 7A to 7G illustrate waveforms of main parts of the block diagram shown in FIG. 6.

Next, another embodiment in which it is not necessary to use such a high-stable MMV will be explained in accordance with FIG. 6 and FIGS. 7A to 7E. Referring to FIG. 6, the numerals 19, 20 and 24 denote DFFs. The reference pulse signal 1 is provided to the input terminals D of the DFFs 19 and 20, the output signal of the VCO6 is provided to the clock terminal CK of the DFF 19 and an inverted pulse from an inverter 21 is provided to the clock terminal CK of the DFF 20.

Figure 7A:
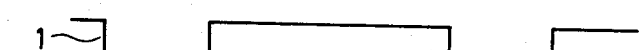
Figure 7B:
Figure 7C:
Figure 7D:
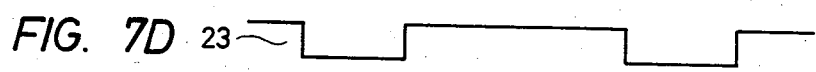
Figure 7E:

In this case, in response to the phase relation between the leading edge a of the reference pulse signal 1 and the leading edge b of the output signal 7, the phase relation between the Q output 23 of the DFF 19 and the Q output 22 of the DFF 20 varies. FIGS. 7C and 7D illustrate the Q outputs 22 and 23, respectively. The Q output 22 is supplied to the clock terminal CK of the DFF 24 and the Q output 23 is supplied to the input terminal D of the DFF 24. As a result, the Q output 25 of the DFF 24 which is a phase error signal becomes low level in the case that the leading edge b is preceding to the leading edge a, which is shown at the left side of FIGS. 7A and 7B, and the Q output 25 of the DFF 24 becomes high level in the case that the leading edge b is delaying from the leading edge a, which is shown at the right side thereof. FIG. 7E illustrates the waveform of the Q output 25. When the Q output 25 is provided to the LPF4, the control voltage 5 decreases in the former case and increases in the latter case. Therefore, in response to the control voltage 5, the VCO6 generates the output signal 7 having the predetermined frequency, so that it becomes possible that the output signal 7 is phase-locked to the reference pulse signal 1.

For example, if the output signal 7 of the VCO6 has the predetermined relation to the frequency of the reference pulse signal 1 at the 70% level of the maximum value of the control voltage 5, the low level period of the Q output 25 and the high level period becomes in the ratio 3:7. Since the phase deviation of the output signal 7 to the reference pulse signal 1 is very little, the leading edge b approximately coincides with the leading edge a.

As is apparent from the above explanation, according to the embodiment shown in FIG. 6, the leading edge b of the output signal 7 is effectively extracted and phase-compared with the leading edge a of the reference pulse signal 1 every repeated period of the reference pulse signal so as to obtain the Q output 25 as the phase error signal.

Figure 7F:
Figure 7G:
Figure 8:
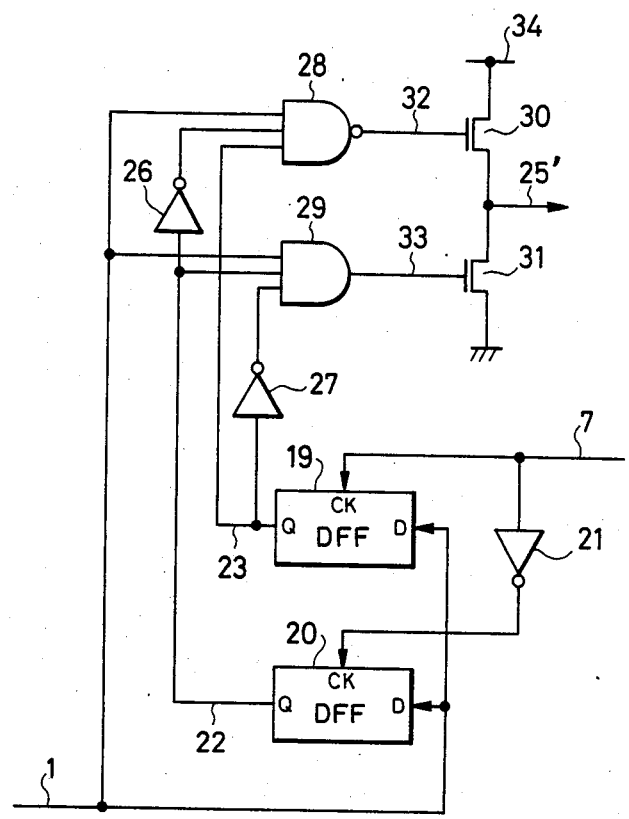
FIG. 8 shows a circuit diagram of another embodiment of the phase comparator 3 and the phase extractor 8 shown in FIG. 1.

FIG. 8 shows another embodiment of the present invention, where, in place of the DFF 24 shown in FIG. 6, a circuit having inverters 26 and 27, a NAND gate 28, and AND gate 29, P-channel MOS transistor 30 and N-channel MOS transistor 31 is used in order to output a phase error signal 25'. FIGS. 7F and 7G illustrate waveforms of the output 32 of the NAND gate 28 and the output 33 of the AND gate 29, respectively. The P-channel MOS transistor 30 conducts at the low level of the output 32 so as to transmit a high level voltage 34 as the phase error signal 25', and is non-conductive at the high level of the output 32. In contrast, the N-channel MOS transistor 31 conducts at the high level of the output 33 so as to transmit a low level voltage, for example, at ground level in FIG. 8, and is non-conductive at the low level of the output 33. Therefore, when the phase error signal is provided to the LPF 4 shown in FIG. 1, it is possible to obtain the same control voltage 5 as the embodiment of FIG. 6.

Figure 9:
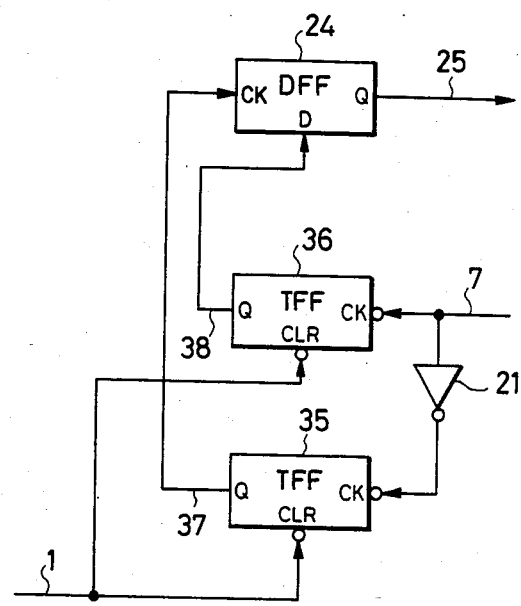
FIG. 9 shows a block diagram of another embodiment of the phase comparator 3 and the phase extractor 8 shown in FIG. 1, FIGS. 10A to 10E illustrate waveforms of main parts of the block diagram shown in FIG. 9.
Figure 10A:
Figure 10B:
Figure 10C:
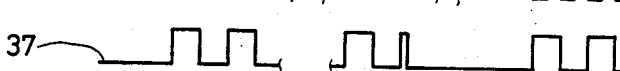
Figure 10D:
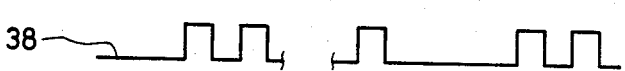
Figure 10E:

FIG. 9 shows another embodiment of the present invention, where in place of the DFFs 19 and 20 shown in FIG. 6 known T-type flip flops (TFFs) 35 and 36 are used. Referring to the TTFs 35 and 36, round marks at the CK terminals mean that the TFFs 35 and 36 operate at trailing edges of the input signals, and round marks at clear terminals (CLR) thereof mean that the TFFs 35 and 36 stop at the low level of the reference pulse signal 1. FIGS. 10A to 10E illustrate waveforms of main parts of the circuit shown in FIG. 9. The reference pulse signal 1 shown in FIG. 10A is delivered to the CLR terminals. The output signal 7 of the VCO6 and the inverted signal thereof are provided to the CK terminals of the TFFs 36 and 35, respectively. When the leading edge b of the output signal 7 precedes the leading edge a of the reference pulse signal 1 as shown in the left side of FIG. 10B, the Q output 37 of the TFF 35 precedes the Q output 38 of the TFF 36 as shown in the right side of FIGS. 10C and 10D. On the contrary, when the leading edge b follows the leading edge a as shown in the right side of FIG. 10B, the Q output 38 of the TFF 36 precedes the Q output 37 of the TFF 35 as shown in the right side of FIGS. 10C and 10D. Therefore, as a result, the same phase error signal can be produced at the Q output of the DFF 24, as shown in FIG. 10E.

By the way, in the embodiment shown in FIG. 9, the TFFs 35 and 36 generate pulses which are two-divided ones of the output signal 7 of the VCO6. For example, when the frequency of the output signal 7 is 14.3 MHz, the frequency of the two divided pulse is about 7.16 MHz. Therefore, in an apparatus dealing with a NTSC television signal, the frequency band of which is about 4 MHz, even if the noise from the TFFs 35 and 36 superimposed on the television signal, the noise could be eliminated by a LPF inserted in a video signal circuit.

Also, in this technical area, it is easily possible to make a circuit, where only the first pulses of the Q outputs 37 and 38 after the leading edge a of the reference pulse signal 1 are provided to the DFF 24 and other pulses of the Q outputs 37 and 38 are not provided.

Further, in place of the inverter 21, it is possible to use a pulse delay circuit having an appropriate delay time, because it is necessary for the clock pulses provided to the CK terminals of the DFF 20 of FIGS. 6 and 8 and the TFF 35 of FIG. 9 only to have a difference with respect to the output signal 7.

Figure 11:
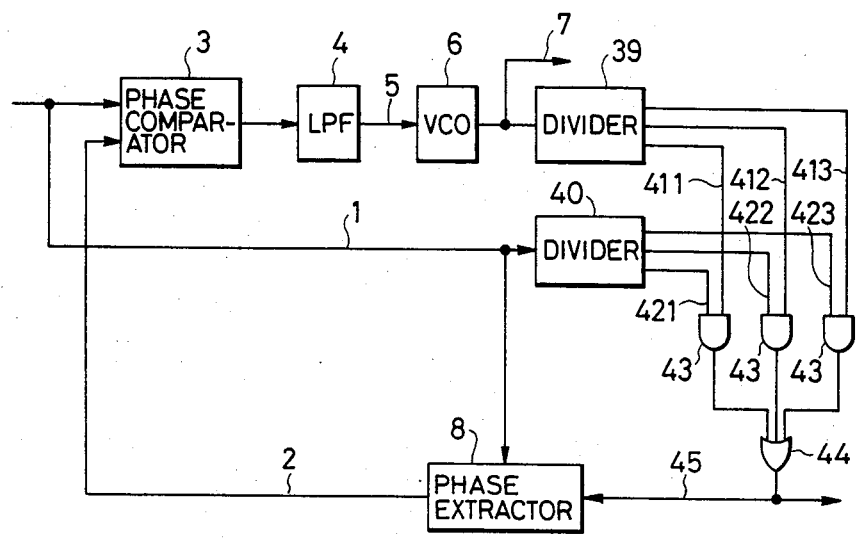
FIG. 11 shows a block diagram of another embodiment of the oscillating circuit of the present invention.

FIG. 11 shows another embodiment of the present invention, where in place of the output signal 7 a pulse 45 which is produced by dividing the output signal 7 is used as an input pulse of the phase extractor 8. In FIG. 11, the pulse 45 is produced by three-dividing the output signal 7. FIGS. 12A to 12I illustrate waveforms of main parts of the circuit shown in FIG. 11.

There is one type of a solid state image device, which uses a clock pulse having a frequency 910/3 times of the horizontal scanning frequency $f_H$, that is, about 4.8 MHz, for example, a solid state image sensor using Solid State Image Device HE98,225 produced by Hitachi Ltd. The embodiment shown in FIG. 11 is suitable to this device.

Figure 12A:
FIGS. 12A to 12I illustrate waveforms of main parts of the block diagram shown in FIG. 11.
Figure 12B:
Figure 12C:
Figure 12D:
Figure 12E:
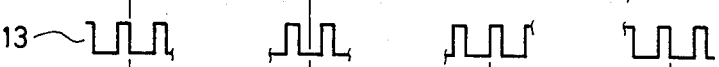
Figure 12F:
Figure 12G:
Figure 12H:
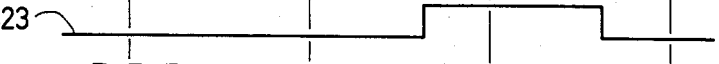
Figure 12I:
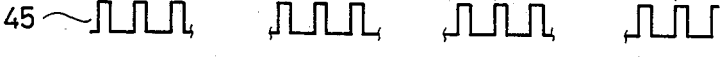

The output signal 7 is divided by a three-divider 39, which produces three phase pulses 411, 412 and 413, the phase deviation of which is one period of the output signal 7 as shown in FIGS. 12C, 12D and 12E. Also, the reference pulse signal 1 is divided by a three-divider 40, which produces three phase pulses 421, 422 and 423 shown in FIGS. 12F, 12G and 12H, respectively. In this technical area, it is well known to construct the three-dividers 39 and 40 with a digital circuit technique. AND gates 43 and an OR gate 44 produce the pulse 45 shown in FIG. 12I based on the three phase pulses 411, 412 and 413. The pulse 45 is one of the three phase pulses 411, 412 and 413 which is sequentially selected. In this configuration, it is possible to obtain the leading edge b of the predetermined pulse of the output signal 7 every repeated period of the reference signal. Therefore, when the pulse 45 is used in place of the output signal 7 of the circuits shown in FIGS. 4, 6, 8 and 9, it becomes possible to effectively obtain the leading edge b of the output pulse 7 every repeated period of the reference pulse signal 1 in order to compare it with the leading edge a of the reference pulse signal.

In this embodiment, since the three-dividers 39 and 40, the AND gate 43 and the OR gate 44 are shared with the circuit for generating the clock pulse having the frequency of 910/3 times of $f_H$, it becomes possible to reduce a total circuit scale.

As detailed above, according to the present invention, when the reference pulse signal having the frequency fo is phase-locked to the output signal having the frequency Nfo provided from the VCO by using the PLL circuit, it is not necessary to use a divider which divides the output signal of the VCO by N times, for example, several hundred times, so that it becomes possible to reduce the total circuit scale and to prevent the noise which would be generated from the divider.

I claim:

1. An oscillating circuit which includes a voltage controlled oscillator (VCO) generating an output of a frequency Nfo (N: an integer, fo: a frequency of a reference signal), comprising:

means for selectively phase-extracting one predetermined oscillating phase of the output of the VCO which appears nearest a predetermined phase of the reference signal every repeated period of the reference signal, means for phase-comparing said extracted oscillating phase with said predetermined phase of the reference signal to generate a phase error signal, and means for producing a control signal for the VCO based on said phase error signal generated from said phase-comparing means.

2. An oscillating circuit according to claim 1, wherein:

said phase-extracting means include two monostable multi-vibrators (MMVs) in series and a D type flip flop (DFF), the first one of said MMVs receiving the reference signal, an output of the second one of said MMVs being provided to an input terminal D of said DF and the output of the VCO being supplied to a clock terminal CK of said DFF.

3. An oscillating circuit according to claim 1, wherein:

said control signal producing means is a low pass filter (LPF).

4. An oscillating circuit according to claim 1, wherein:

said phase-extracting means includes two DFFs, the first DFF of which receives the reference signal at an input terminal D and the output of the VCO at a clock terminal CK, the second DFF of which receives the reference signal at an input terminal D and a pulse signal having a phase different from the phase of the output of the VCO at a clock terminal, and said phase comparing means comprises a third DFF of which receives a Q output of said second DFF at a clock terminal CK and a Q output of said first DFF at an input terminal D and generates said phase error signal as a Q output thereof.

5. An oscillating circuit according to claim 4, wherein:

said pulse signal having a phase different from the phase of the output is produced by inverting the output of the VCO.

6. An oscillating circuit according to claim 1, wherein:

said phase-extracting means includes two T type flip-flops (TFFs), the first one of said TFFs receiving an inverted signal of the reference signal at a clear terminal CLR and an inverted signal of the output of the VCO at a clock terminal CK, the second one of said TFFs receiving an inverted signal of the reference signal at a clear terminal CLR and the output of the VCO at a clock terminal CK, and said phase-comparing means comprises a DFF receiving a Q output of said second TFF at a clock terminal CK and a Q output of said first TFF at an input terminal D and produces said phase error signal as a Q output thereof.

7. An oscillating circuit using a phase locked loop which includes a voltage controlled oscillator (VCO) generating an output of a frequency Nfo (N; an integer, fo: a frequency of a reference signal for the phase locked loop), comprising:

means for phase-comparing a predetermined phase of the reference signal with an extracted predetermined oscillating phase of the output of the VCO every repeated period of the reference signal in order to generate a phase error signal;, said extracted predetermined oscillating phase being selectively extracted from a single predetermined oscillating phase of the output of the VCO which is nearest said predetermined phase of the reference signal, and means for producing a control signal for the VCO based on said phase error signal.

8. An oscillating circuit according to claim 7, wherein:

said predetermined oscillating phases of the output of the VCO are represented by leading edges of the output.

9. An oscillating circuit according to claim 8, wherein:

said predetermined phase of the reference signal is represented by a lead edge of the reference signal.

10. An oscillating circuit according to claim 7, wherein:

said phase-comparing means includes a first and a second D-type flip flops (DFFs), input terminals D of which receive the reference signal and clock terminals CK of which receive clock pulses which have different phase with repect to each other and are produced based on the output of the VCO.

11. An oscillating circuit according to claim 10, wherein:

said phase-comparing means further includes a third DFF, an input terminal D of which receives an output Q of said second DFF and a clock terminal CK of which receives an output Q of said first DFF.

12. An oscillating circuit according to claim 7, wherein:

said phase-comparing means includes a first and a second T-type flip flops (TFFs), clear terminals CLR of which are connected to receive a clear pulse based on the reference signal and clock terminals CK of which receive clock pulses which have different phase with respect to each other and are produced on the basis of the output of the VCO.

13. An oscillating circuit according to claim 12, wherein:

said phase-comparing means further includes a D type flip flop (DFF), an input terminal D of which receives an output Q of said second TFF and a clock terminal CK of which receives an output Q of said first TFF.

14. An oscillating circuit according to claim 7, further comprising:

means inserted between the VCO and said phase-comparing means for three-dividing the output of the VCO.

* * * * *